(12) United States Patent
Esch, Jr.

(10) Patent No.: US 6,268,750 B1
(45) Date of Patent: Jul. 31, 2001

(54) FLATTENED RESISTANCE RESPONSE FOR AN ELECTRICAL OUTPUT DRIVER

(75) Inventor: Gerald L Esch, Jr., Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/481,467

(22) Filed: Jan. 11, 2000

(51) Int. Cl.[7] .................................................. H03H 11/26
(52) U.S. Cl. ........................... 327/170; 327/270; 326/27; 326/87
(58) Field of Search .................................. 326/26, 27, 30, 326/82, 83, 86, 87; 327/170, 392, 293, 276, 270, 281, 269

(56) References Cited

U.S. PATENT DOCUMENTS 5,773,999 * 6/1998 Park et al. ............................ 327/108
5,887,150 * 3/1999 Schneider et al. ................... 395/306
6,133,757 * 10/2000 Huang et al. .......................... 326/87

* cited by examiner

Primary Examiner—Tuan T. Lam
Assistant Examiner—Hiep Nguyen

(57) ABSTRACT

A method and circuit for flattening the output resistance response on a signal pad of an integrated circuit is presented. Impedance matching is accomplished using pull-up and pull-down FET arrays. Various combinations of pull-up PFETs in the pull-up FET array are programmably enabled by a pull-up calibration word when driving the output pad high. Various combinations of pull-down NFETs in the pull-down FET array are programmably enabled by a pull-down calibration word when driving the output pad low. An NFET in the pull-up FET calibration array and a PFET in the pull-down FET array respectively allow the output driver to supply more current during the initial stages of a voltage transition, resulting in a flatter overall output resistance $R_o$ response.

17 Claims, 2 Drawing Sheets

The present invention pertains generally to digital output drivers for CMOS integrated circuits, and more particularly to a method and apparatus for flattening the output resistance response of digital output drivers.

FLATTENED RESISTANCE RESPONSE FOR AN ELECTRICAL OUTPUT DRIVER

FIELD OF THE INVENTION

The present invention pertains generally to digital output drivers for CMOS integrated circuits, and more particularly to a method and apparatus for flattening the output resistance response of digital output drivers.

BACKGROUND OF THE INVENTION

Integrated circuits are commonly packaged as chips. An integrated circuit within a chip communicates with the world outside the chip through metalization layers on the outside of the chip known as signal pads. In order for an integrated circuit within the chip to send signals outside of the chip, the integrated circuit requires an output driver circuit, which drives a signal from the integrated circuit onto an output signal pad.

The signal pads on a chip are connected to the packaging of the chip (e.g., a pin) which is then connected to a signal trace on a printed circuit board which runs to another integrated chip or electronic device. The electrical connection of the signal pad through the packaging of the chip to the signal trace contains parasitic resistance, inductance, and capacitance which affects the transmission of the signal from the signal pad. This parasitic resistance, capacitance, and inductance is often referred to as the characteristic package impedance.

The signal trace itself also contains transmission line characteristics which include resistance, capacitance, and inductance, defined by the characteristic impedance of the printed circuit (PC) board transmission line, or $Z_o$, which also affects the quality of the transmitted signal from the signal pad.

As known by those skilled in the art, it is important to match the driver output resistance $R_o$ of the output pad to the characteristic board impedance of the transmission line in order to avoid signal reflections due to voltage level switching on the pad, and therefore undesirable signal degradation.

Impedance matching of an output driver to the characteristic impedance of the signal trace presents several problems. First, process variations inherent in the manufacturing process of integrated circuits, such as the transistor implanting doping level, the effective length of channels in the field effect transistors (FETs), the thickness of the gate oxide for transistors, and the diffusion resistance, can cause the output resistance of two supposedly identical circuits to differ. In addition, variations in voltage and temperature can cause variations in the output resistance of a given chip. Specifically, the output resistance $R_o$ response can vary significantly as the signal on the pad transitions from one voltage level to another. In another example, when the temperature of an integrated circuit approaches its maximum operating temperature, the resistance of the FETs in the integrated circuit increases.

In view of the above, it is clear that a need exists for an output driver circuit that is characterized by a relatively constant output impedance $R_o$ over all process, voltage, and temperature ranges.

One prior art technique for accomplishing impedance matching of output pads for integrated circuits is described in U.S. pat. application Ser. No. [UNKNOWN], entitled "Digitally Controlled Output Driver and Method for Impedance Matching", herein incorporated by reference for all that it teaches. Output driver impedance matching according to this technique is accomplished by programmably enabling various combinations of pull-up PFETs while driving the output pad high and various combinations of pull-down NFETS while driving the output pad low. While this type of programmed impedance matching significantly improves the output resistance curve, problems still remain. Due to the variations in the gate-to-source voltage Vgs, drain-to-source voltage Vds, and back gate voltage in the output driver's PFET and NFETs, the output resistance $R_o$ still varies as the output voltage Vo transitions between logic states. For example, a voltage transition from a logic level low state ("0") to a logic level high state ("1") can result in an output resistance variation of between 68% above and 36% below the target $R_o$ as measured at 10% $V_o$ and 90% $V_o$. During a voltage transition from a logic level high state ("1") to a logic level low state ("0"), the output resistance $R_o$ can vary between 57% above and 25% below the target $R_o$ as measured at 10% $V_o$ and 90% $V_o$.

Accordingly, a need exists for a method and circuit for further improving the impedance matching of an output driver which results in an improved output resistance curve over all process, temperature, and voltage variations on an output pad.

SUMMARY OF THE INVENTION

The present invention is a novel method and apparatus for improving the output resistance response of a digital output driver that results from state level transitions in the output voltage. The invention delivers a precise, relatively constant driver output resistance $R_o$ during voltage level transitions on the output pad over all process, voltage, and temperature ranges.

In accordance with the invention, impedance matching is accomplished in an output driver by programmably enabling various combinations of pull-up PFETs when driving the output pad high and by programmably enabling various combinations of pull-down NFETs when driving the output pad low. A pull-up calibration word PU_N[n:0] is used to drive a pull-up PFET calibration array, while a pull-down calibration word PD[n:0] is used to drive a pull-down NFET calibration array. The calibration array FETs (PFETs and NFETs) are sized such that the FETs have conductances corresponding to their binary weighted bit position in their respective calibration word PU_N[n:0] or PD[n:0]. In other words, each FET in its respective pull-up PFET calibration array or pull-down NFET calibration array has a conductance of $2^{(bit\ position)}G$. Thus, if bit 0 of the calibration word controls a FET with conductance G, bit 1 of the calibration word controls a FET with a conductance 2*G, bit 2 of the calibration word controls a FET with a conductance 2*G, and so on. In effect, as the calibration word binary count increments, more resistors are added in parallel in the driver FET array, and the output resistance $R_o$ drops. Having separate and independent calibration word for each of the pull-up PFET calibration array and the pull-down NFET calibration array enables the output driver to offer precision impedance matching over all process, voltage, and temperature ranges.

In the present invention, an additional NFET is added to the pull-up PFET calibration array and an additional PFET is added to the pull-down NFET calibration array. The addition of these two FETs allows the output driver to supply more current during the initial stages of a voltage transition, resulting in a flatter overall output resistance $R_o$ response. For example, during a low-to-high transition, the pull-up NFET is conducting. As the output voltage $V_o$ approaches $V_{DD}-V_t$ from 0V, the NFET enters the cut-off region and allows the calibrated pull-up PFET array to determine the driver's output resistance $R_o$ when $(V_{DD}-V_t) \leq V_o \leq V_{DD}$. The pull-down PFET behaves in a similar fashion during a high-to-low transition.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method and apparatus for improving the impedance matching of an output driver during output voltage transitions is described in detail hereinafter.

Figure 1:
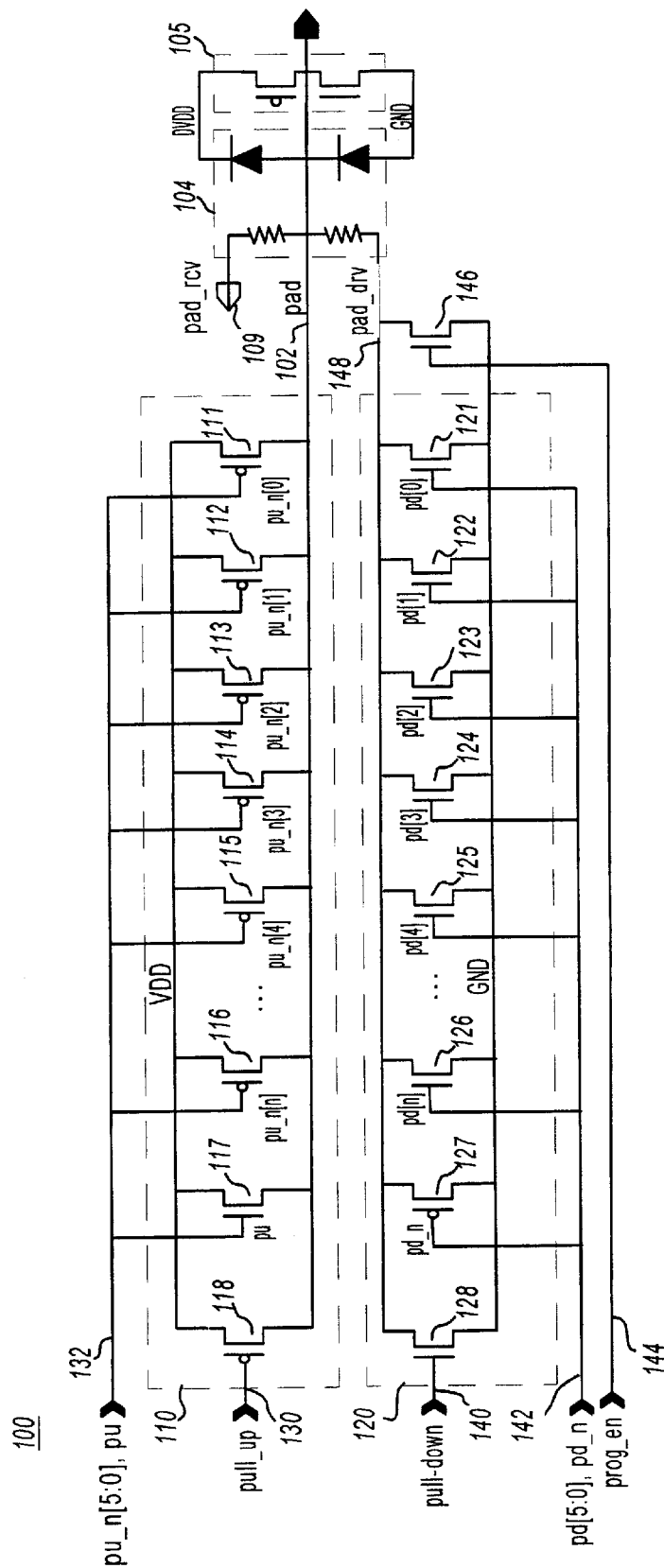
FIG. 1 is a schematic diagram of an output driver containing the calibration arrays of the invention.

FIG. 1 is a schematic diagram of an output driver illustrating the features of the invention. As illustrated, the output driver, shown at 100, includes an output pad node 102, electrostatic discharge (ESD) protection circuitry 104, noise suppression (voltage clamping) circuitry 105, a pull-up PFET calibration array 110, and a pull-down NFET calibration array 120. The use of ESD protection circuitry 104 and noise suppression circuitry 105 are well known in the art as are various implementation techniques.

Pull-up PFET calibration array 110 includes an array of PFETs 111–116 that are electrically connected in parallel, such that the source node of each PFET is electrically connected with the source nodes of each of the other PFETs, and the drain node of each PFET is electrically connected with the drain nodes of each of the other PFETs. The source node of each of the PFETs is electrically connected to a power source having a potential VDD. The drain node of each of the PFETs is electrically connected to the output pad 102. The gate of each of the PFETs is electrically connected to a different bit signal of a pull-up calibration word signal. In accordance with the preferred embodiment, the pull-up PFET calibration array 110 includes six PFET devices 111, 112, 113, 114, 115, 116 of varying conductances. The gate of each PFET 111–116 is driven by a different bit signal of a pull-up calibration word signal pu_n[5:0]. In the preferred embodiment, the conductance of each successive PFET in the array varies according to the bit position of the calibration word signal driving its gate to satisfy the relation $2^{(bit\ position)} * G$. In other words, the PFETs in the preferred embodiment are sized such that the PFETs have conductances corresponding to their binary weighted bit position in the pull-up calibration word. For example, pu_n[0] controls the gate of PFET 111, which has a conductance G. Signal pu_n[1] controls the gate of PFET 112 which has a conductance 2*G; signal pu_n[2] controls the gate of PFET 113 which has a conductance 4*G; and so on up to signal pu_n[5] which controls the gate of PFET 116 which has a conductance 32*G. In effect, as the calibration word binary count increments, more resistors are added in parallel in the driver's pull-up PFET calibration array, causing the output resistance $R_o$ (as seen on the output pad) to drop.

Pull-up calibration array 110 also includes a PFET 118 that is driven by a signal pull_up, which is asserted (PFET 118 is turned on) when the output pad 102 is to be driven from a low state to a high state. PFET 118 is always turned on during a low-to-high transition of the voltage on the output pad 102. This ensures that the signal on the output pad 102 will be pulled high when the pad 102 is to driven high (if the calibration word causes none of the PFETs in the PFET array to conduct). Accordingly, the output impedance will have a minimum value based on the size of PFET 118. In the preferred embodiment, PFET 118 is sized to have a conductance value near the center conductance value of the various PFETs 111–116 in the PFET array. Accordingly, in the preferred embodiment, PFET 118 is sized to have a conductance value at approximately 8G.

Pull-up calibration array 110 also includes an additional NFET 117 having a source coupled to voltage potential DVDD and the sources of each of the PFETs 111–116 and the pre-driver FET 118, and a drain coupled to drains of each of PFETs 111–116, pre-driver FET 118, and the output pad 102. The gate of NFET 117 is controlled by pull-up signal pu. Pull-up signal pu is high when the output pad 102 is driven to a logical high state. NFET 117 allows the output driver 100 to supply more current during the initial stages of a transition of the output voltage $V_o$ on pad 102. For example, during a low-to-high transition, where $0V <= V_o < (V_{DD}-V_t)$, pull-up NFET 117 is conducting. As $V_o$ approaches VDD, NFET 117 enters its cut-off region; thus supplying no current. This then allows the PFETs in the calibrated pull-up PFET array 111–116,118 to pull the current during the latter half of the voltage transition to determine the driver's output resistance $R_o$.

Figure 2:
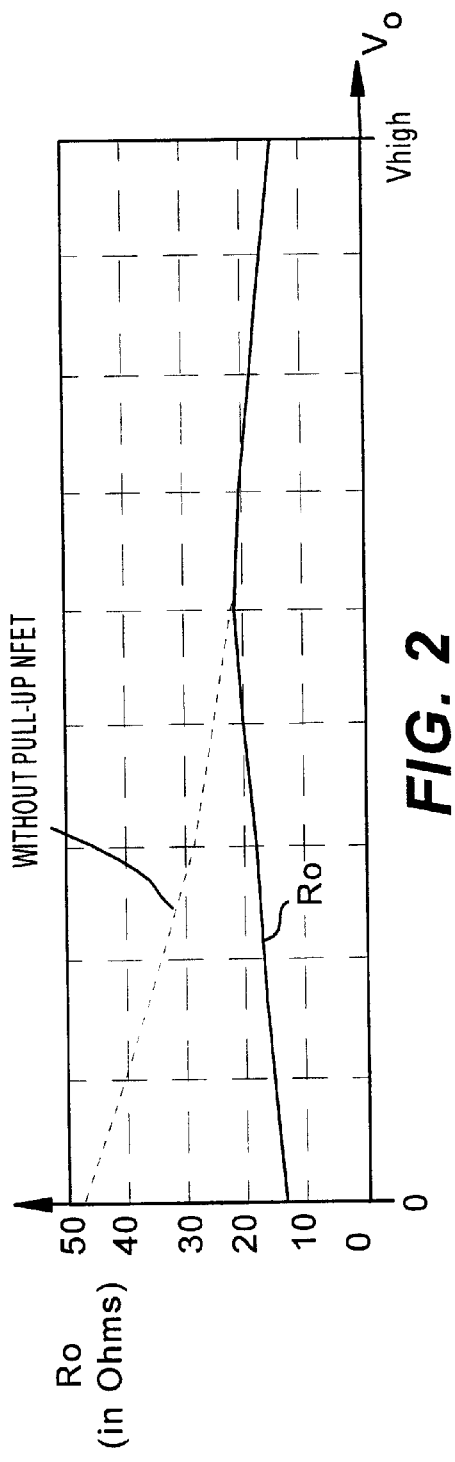
FIG. 2 is a graph illustrating the output resistance $R_o$ vs. output voltage $V_o$ during a low-to-high voltage transition.

FIG. 2 is a graph illustrating the output resistance $R_o$ vs. driver output voltage $V_o$ during a low-to-high voltage transition. When the output pad 102 is to be driven high, all of the FETs (NFETs 121–126 and 128, and PFET 127) in the pull-down calibration array 120 are turned off, PFET 118 and pull-up NFET 117 are turned on, and various combinations of PFETs 111–116 (as determined via a calibration method) are turned on. As measured from the target calibration point of $V_{DD}/2$, during a low-to-high transition, $R_o$ can vary +0% above and 27% below the target $R_o$, measured when $V_o$ is at 10% and at 90%. As shown in FIG. 2, as $V_o$ increases from 0V to $V_{DD}$, the output resistance $R_o$ measured between 10% and 90% of $V_o$ varies by about only 2 ohms—a considerable improvement over the prior art.

It is shown from the graph in FIG. 2 that during the initial part of the low-to-high output voltage transition, the pull-up NFET 117 assists in keeping the initial part of the output resistance $R_o$ curve lower, while the PFETs perform this function during the latter half of the transition. In other words, the conductance of pull-up NFET 117 helps lower the driver's output resistance $R_o$ during the first half of the low-to-high transition, while the conductance of the programmed PFET array dominates the driver's output resistance $R_o$ during the second half of the transition.

The pull-down NFET array 120 operates similarly to the pull-up PFET array 110 just described. In particular, pull-down NFET calibration array 120 includes an array of NFETs 121–126 that are electrically connected in parallel, such that the source node of each NFET is electrically connected with the source nodes of each of the other NFETs, and the drain node of each NFET is electrically connected with the drain nodes of each of the other NFETs. The source node of each of the NFETs is electrically connected to the circuit ground having potential DGND. The drain node of each of the NFETs is electrically connected to the output pad 148. The gate of each of the NFETs is electrically connected to a different bit signal of a pull-down calibration word signal. In accordance with the preferred embodiment, the pull-down NFET calibration array 120 includes six NFET devices 121, 122, 123, 124, 125, 126 of varying conductances. The gate of each NFET 121–126 is driven by a different bit signal of a pull-down calibration word signal pd[5:0]. In the preferred embodiment, the conductance of each successive NFET in the array varies according to the bit position of the calibration word signal driving its gate to satisfy the relation $2^{(bit\ position)}*G$, similar to the PFETs of the pull-up PFET array 110. In other words, the NFETs in the preferred embodiment are sized such that the NFETs have conductances corresponding to their binary weighted bit position in the pull-down calibration word. Thus, pd[0] controls the gate of NFET 121, which has a conductance G. Signal pd[1] controls the gate of NFET 122 which has a conductance 2*G; signal pd[2] controls the gate of NFET 123 which has a conductance 4*G; and so on up to signal pd[5] which controls the gate of NFET 126 which has a conductance 32*G. In effect, as the calibration word binary count increments, more resistors are added in parallel in the driver's pull-down NFET calibration array, causing the output resistance $R_o$ (as seen on the output pad) to decrease.

Pull-down calibration array 120 also includes a NFET 128 that is driven by a signal pull_down, which is asserted (NFET 128 is turned on) when the output pad 102 is to be driven from a high state to a low state. NFET 128 is always turned on during a high-to-low transition of the voltage on the output pad 102. This ensures that the signal on the output pad 148 will be pulled low when the pad 102 is to be driven low (if the calibration word causes more of the NFETs in the NFET array to conduct). Accordingly, the output impedance will have a minimum resistance value based on the size of NFET 128. In the preferred embodiment, NFET 128 is sized to have a conductance value near the center conductance value of the various NFETs 121–126 in the NFET array. Accordingly, in the preferred embodiment, NFET 128 is sized to have a conductance value at approximately 8G.

Pull-down calibration array 120 also includes an additional PFET 127 having a source coupled to voltage potential DGND (ground) and the sources of each of the NFETs 121–126 and the pre-driver FET 128, and a drain coupled to drains of each of NFETs 121–126, pre-driver FET 128, and the output pad 102. The gate of PFET 127 is controlled by pull-down signal pd_n. Pull-down signal pd_n is low when the output pad 102 is to be driven to a logical low state. PFET 127 allows the output driver 100 to supply more current during the initial stages of a transition of the output voltage $V_o$ on pad 102. For example, during a high-to-low transition, where $0V<=V_o<(V_{DD}-V_t)$, pull-down PFET 127 is conducting. As $V_o$ approaches $V_{DD}$, PFET 127 enters its cut-off region, thus pulling no current. This then allows the NFETs in the calibrated pull-down NFET array 121–126, 128 to pull the current during the latter half of the voltage transition to dominate the driver's output resistance $R_o$.

Figure 3:
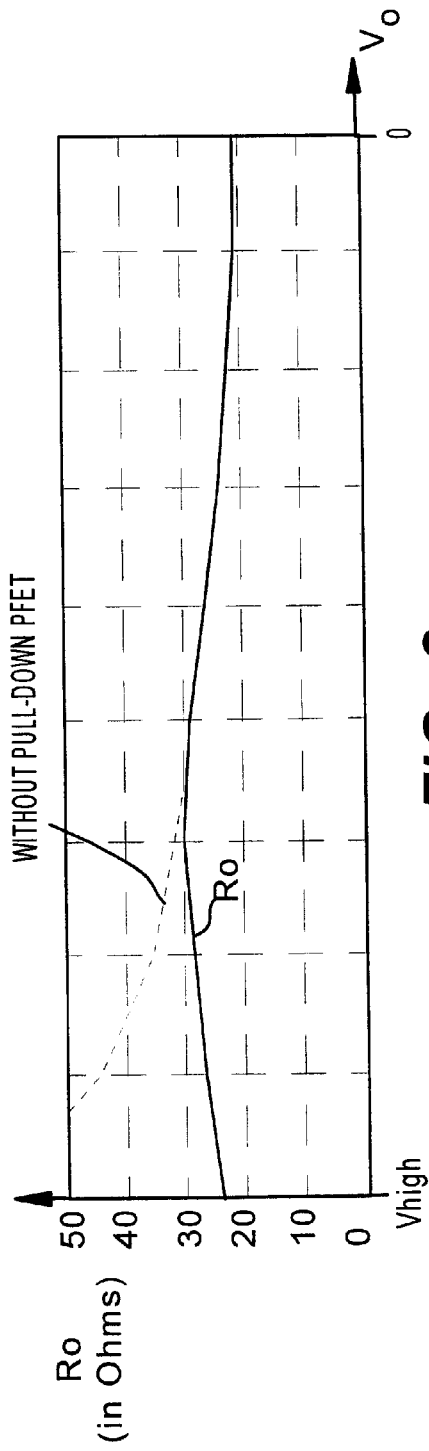
FIG. 3 is a graph illustrating the output resistance $R_o$ vs. output voltage $V_o$ during a high-to-low voltage transition.

FIG. 3 is a graph illustrating the output resistance $R_o$ vs. driver output voltage $V_o$ during a high-to-low voltage transition. When the output pad 102 is to be driven low, all of FETs (PFETs 111–116 and 118, and NFET 117) in the pull-up calibration array 110 are turned off, pre-driver NFET 128 and pull-down PFET 127 are turned on, and various combinations of NFETs 121–126 (as determined via a calibration method) are turned on. As measured from the calibration point of $V_{DD}/2$, during a low-to-high transition, $R_o$ can vary 0% above to 25% below the target $R_o$ as measured when $V_o$ is at 10% and at 90%. As shown in FIG. 3, as $V_o$ decreases from VDD down to 0V, the output resistance $R_o$ measured between 10% and 90% of $V_o$ varies by about only 4 ohms—also a considerable improvement over the prior art.

It is shown from the graph of FIG. 3 that during the initial part of the low-to-high output voltage transition, the pull-down NFET 127 assists in keeping the initial part of the output resistance $R_o$ curve lower, while the NFETs perform this function during the latter half of the transition. In other words, the conductance of pull-down NFET 127 dominates the driver's output resistance $R_o$ during the first half of the low-to-high transition, while the conductance of the programmed NFET array dominates the driver's output resistance $R_o$ during the second half of the transition.

It will be appreciated that even though the output resistance $R_o$ is not completely flattened during the output voltage $V_o$ level transitions, it is desirable (for example, in a point-to-point environment) to have periods of low output resistance while $0<=V_o<VDD/2$ and $VDD/2<V_o<=VDD$ given RO equals the board impedance when $V_o=VDD/2$. These periods of low resistance can be created by increasing the widths of the pull-up NFET 117 and pull-down PFET 127, thus reducing transition times. Increasing the width of the pull-up NFET 117 and pull-down PFET 127 in concert with matching the driver's output resistance with the board impedance at $V_o=VDD/2$ will create a critically damped waveform.

It will also be appreciated that having separate and independent calibration words for the pull-up and pull-down FETs enables the output driver to offer precision impedance matching over all process, voltage, and temperature ranges.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A circuit for controllably varying the output impedance of an output driver circuit that is configured to drive a signal through a signal pad on a semiconductor device, comprising:

a first FET array comprising a plurality of field effect transistors (FETs) electrically connected in parallel between a first voltage source and the signal pad, said first FET array comprising at least one of p-channel field effect transistor (PFET) and at least one of an n-channel field effect transistor (NFET), wherein at least one of said at least one p-channel field effect transistor (PFET) and at least one of said at least one n-channel field effect transistor (NFET) in said first FET array are enabled to conduct current when said signal pad is driven to a first voltage level, and wherein all of said plurality of FETs in said first FET array are disabled from conducting current when said signal pad is not driven to said first voltage level;

wherein a predetermined combination of said remaining FETs in said first FET array are enabled to conduct current when said signal pad is driven to said first voltage level.

2. A circuit in accordance with claim 1, comprising:

a second FET array comprising a plurality of field effect transistors (FETs) electrically connected in parallel between a second voltage source and the signal pad, said second FET array comprising at least one of a p-channel field effect transistor (PFET) and at least one of an n-channel field effect transistor (NFET), wherein at least one of said at least one p-channel field effect transistor (PFET) and at least one of said at least one n-channel field effect transistor (NFET) in said second FET array are enabled to conduct current when said signal pad is driven to a second voltage level different than said first voltage level, and wherein all of said plurality of FETs in said second FET array are disabled from conducting current when said signal pad is not driven to said second voltage level.

3. A circuit in accordance with claim 2, wherein:

a predetermined combination of said remaining FETs in said second FET array are enabled to conduct current when said signal pad is driven to said second voltage level.

4. A circuit in accordance with claim 1, comprising:

a second FET array comprising a plurality of field effect transistors (FETs) electrically connected in parallel between a second voltage source and the signal pad, said second FET array comprising at least one of p-channel field effect transistor (PFET) and at least one of an n-channel field effect transistor (NFET), wherein at least one of said at least one p-channel field effect transistor (PFET) and at least one of said at least one n-channel field effect transistor (NFET) in said second FET array are enabled to conduct current when said signal pad is driven to a second voltage level different than said first voltage level, and wherein all of said plurality of FETs in said second FET array are disabled from conducting current when said signal pad is not driven to said second voltage level.

5. A circuit in accordance with claim 4, wherein:

a predetermined combination of said remaining FETs in said second FET array are enabled to conduct current when said signal pad is driven to said second voltage level.

6. A variable impedance output driver for driving a signal through a signal pad on a semiconductor device, the output driver comprising:

a pull-up field effect transistor (FET) array comprising a plurality of p-channel field effect transistors (PFETs) and a pull-up n-channel field effect transistor (NFET) electrically connected in parallel between a high voltage source and said signal pad; and a pull-down FET array comprising a plurality of n-channel field effect transistors (NFETs) and a pull-down p-channel field effect transistor (PFET) electrically connected in parallel between a low voltage source and said signal pad;

wherein a first PFET of the plurality of PFETs, the pull-up NFET, and a pre-determined combination of the remaining PFETs in the pull-up FET array are each turned on when the signal pad is driven to a high voltage level and are otherwise turned off, and a first NFET of the plurality of NFETs, the pull-down PFET, and a pre-determined combination of the remaining NFETs in the pull-down FET array are each turned on when the signal pad is driven to a low voltage level and are otherwise turned off.

7. A driver in accordance with claim 6, wherein:

the remaining PFETs in said pull-up FET array are variably sized.

8. A driver in accordance with claim 7, wherein:

the remaining PFETs are sized to have progressively smaller width dimensions.

9. A driver in accordance with claim 7, wherein:

the remaining PFETs are sized to have width dimensions that progressively vary by a factor of 2.

10. A driver in accordance with claim 6, wherein:

the remaining NFETs in said pull-down FET array are variably sized.

11. A driver in accordance with claim 10, wherein:

the remaining NFETs are sized to have progressively smaller width dimensions.

12. A driver in accordance with claim 10, wherein:

the remaining NFETs are sized to have width dimensions that progressively vary by a factor of 2.

13. A method for controllably varying the output impedance of an output driver circuit that is configured to drive a signal through a signal pad on a semiconductor device, said output driver circuit comprising a first FET array comprising a plurality of field effect transistors (FETs) electrically connected in parallel between a first voltage source and the signal pad, said first FET array comprising at least one of a p-channel field effect transistor (PFET) and at least one of an n-channel field effect transistor (NFET), the method comprising the steps of:

enabling current conduction through at least one of said at least one p-channel filed effect transistor (PFET) and at least one of said at least one n-channel field effect transistor (NFET) in said first FET array when said signal pad is driven to a first voltage level; and disabling current conduction through all of said plurality of FETs in said first FET array when said signal pad is not driven to said first voltage level; and conducting current through a predetermined combination of said remaining FETs in said first FET array when said signal pad is driven to said first voltage level.

14. A method in accordance with claim 13, wherein said output driver circuit comprises a second FET array comprising a plurality of field effect transistors (FETs) electrically connected in parallel between a second voltage source and the signal pad, said second FET array comprising at least one of a p-channel field effect transistor (PFET) and at least one of an n-channel field effect transistor (NFET), the method comprising the steps of:

enabling current conduction through at least one of said at least one p-channel field effect transistor (PFET) and at least one of said at least one n-channel field effect transistor (NFET) in said second FET array when said signal pad is driven to a second voltage level different than said first voltage level; and disabling current conduction through all of said plurality of FETs in said second FET array when said signal pad is not driven to said second voltage level.

15. A method in accordance with claim 14, comprising:

conducting current through a predetermined combination of said remaining FETs in said second FET array when said signal pad is driven to said second voltage level.

16. A method in accordance with claim 13, wherein said output driver circuit comprises a second FET array comprising a plurality of field effect transistors (FETs) electrically connected in parallel between a second voltage source and the signal pad, said second FET array comprising at least one of a p-channel field effect transistor (PFET) and at least one of an n-channel field effect transistor (NFET), the method comprising the steps of:

enabling current conduction through at least one of said at least one p-channel filed effect transistor (PFET) and at least one of said at least one n-channel field effect transistor (NFET) in said second FET array when said signal pad is driven to a second voltage level different than said first voltage level; and disabling current conduction through ail of said plurality of FETs in said second FET array when said signal pad is not driven to said second voltage level.

17. A method in accordance with claim 16, comprising:

conducting current through a predetermined combination of said remaining FETs in said second FET array when said signal pad is driven to said second voltage level.

* * * * *